(12) United States Patent
Matsuura et al.

(10) Patent No.: US 9,958,719 B2
(45) Date of Patent: May 1, 2018

(54) SEMICONDUCTOR DEVICE HAVING MULTIPLE INSULATING FILMS OF VARYING THICKNESS

(71) Applicant: Japan Display Inc., Minato-ku (JP)

(72) Inventors: Yuki Matsuura, Tokyo (JP); Osamu Itou, Tokyo (JP)

(73) Assignee: Japan Display Inc., Minato-ku (JP)

( * ) Notice: Subject to any disclaimer, the term of this patent is extended or adjusted under 35 U.S.C. 154(b) by 0 days. days.

(21) Appl. No.: 15/397,401

(22) Filed: Jan. 3, 2017

(65) Prior Publication Data

US 2017/0205660 A1 Jul. 20, 2017

(30) Foreign Application Priority Data

Jan. 15, 2016 (JP) .................................. 2016-006120

(51) Int. Cl.

| | |
|---|---|
| *G02F 1/1368* | (2006.01) |
| *G02F 1/1333* | (2006.01) |
| *G02F 1/1343* | (2006.01) |
| *G02F 1/1362* | (2006.01) |
| *H01L 27/12* | (2006.01) |
| *G02F 1/1339* | (2006.01) |

(52) U.S. Cl.
CPC ...... *G02F 1/133345* (2013.01); *G02F 1/1368* (2013.01); *G02F 1/134309* (2013.01); *G02F 1/136227* (2013.01); *H01L 27/1218* (2013.01); *H01L 27/1248* (2013.01); *G02F 1/13394* (2013.01); *G02F 2001/136222* (2013.01); *G02F 2201/121* (2013.01); *G02F 2201/123* (2013.01)

(58) Field of Classification Search
CPC ............. H01L 27/1248; H01L 27/1218; G02F 1/134309
See application file for complete search history.

(56) References Cited

U.S. PATENT DOCUMENTS

| | | | |
|---|---|---|---|
| 9,653,487 B2* | 5/2017 | Yamazaki | ........... H01L 27/1225 |
| 2007/0224740 A1* | 9/2007 | Fukuda | ............... H01L 27/1214 438/149 |
| 2011/0205468 A1* | 8/2011 | Hirakata | ........... G02F 1/133526 349/95 |
| 2016/0062169 A1* | 3/2016 | Park | .................. G02F 1/133514 349/44 |
| 2017/0038651 A1* | 2/2017 | Takamaru | ............. G02F 1/1368 |

FOREIGN PATENT DOCUMENTS

JP          9-258207        10/1997

* cited by examiner

*Primary Examiner* — Joseph C Nicely
*Assistant Examiner* — Antonio Crite
(74) *Attorney, Agent, or Firm* — Oblon, McClelland, Maier & Neustadt, L.L.P.

(57) ABSTRACT

According to one embodiment, a display device includes an insulating substrate, a first insulating film, a second insulating film, a third insulating film, a fourth insulating film, a fifth insulating film, a sixth insulating film, a color filter layer, a semiconductor layer disposed between the second insulating film and the third insulating film, and a gate electrode disposed between the third insulating film and the fourth insulating film, wherein the first, fourth, and sixth insulating films are formed of a silicon nitride, and the second, third, and fifth insulating films are formed of a silicon oxide.

4 Claims, 11 Drawing Sheets

|  |  | W5 | | | |
|---|---|---|---|---|---|
|  |  | 500~450nm | 450~400nm | 400~350nm | 350~300nm |
| W4 | 450~500nm | NG1 | NG1 | OK2 | NG1 |
|  | 400~450nm | NG2 | OK1 | NG3 | NG1 |
|  | 350~400nm | NG1 | OK1 | OK1 | NG1 |
|  | 300~350nm | NG1 | OK2 | NG3 | NG2 |

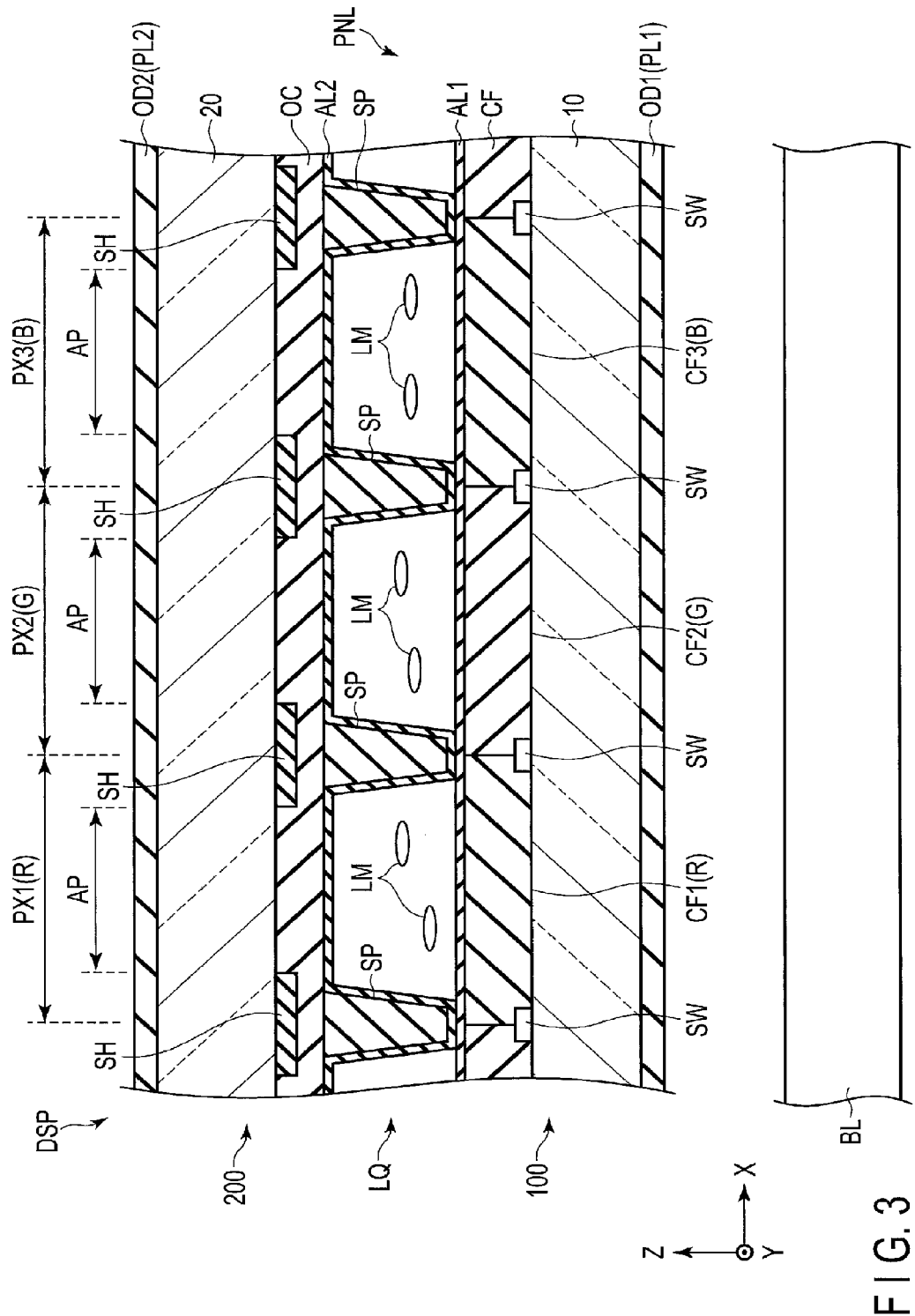
F I G. 3

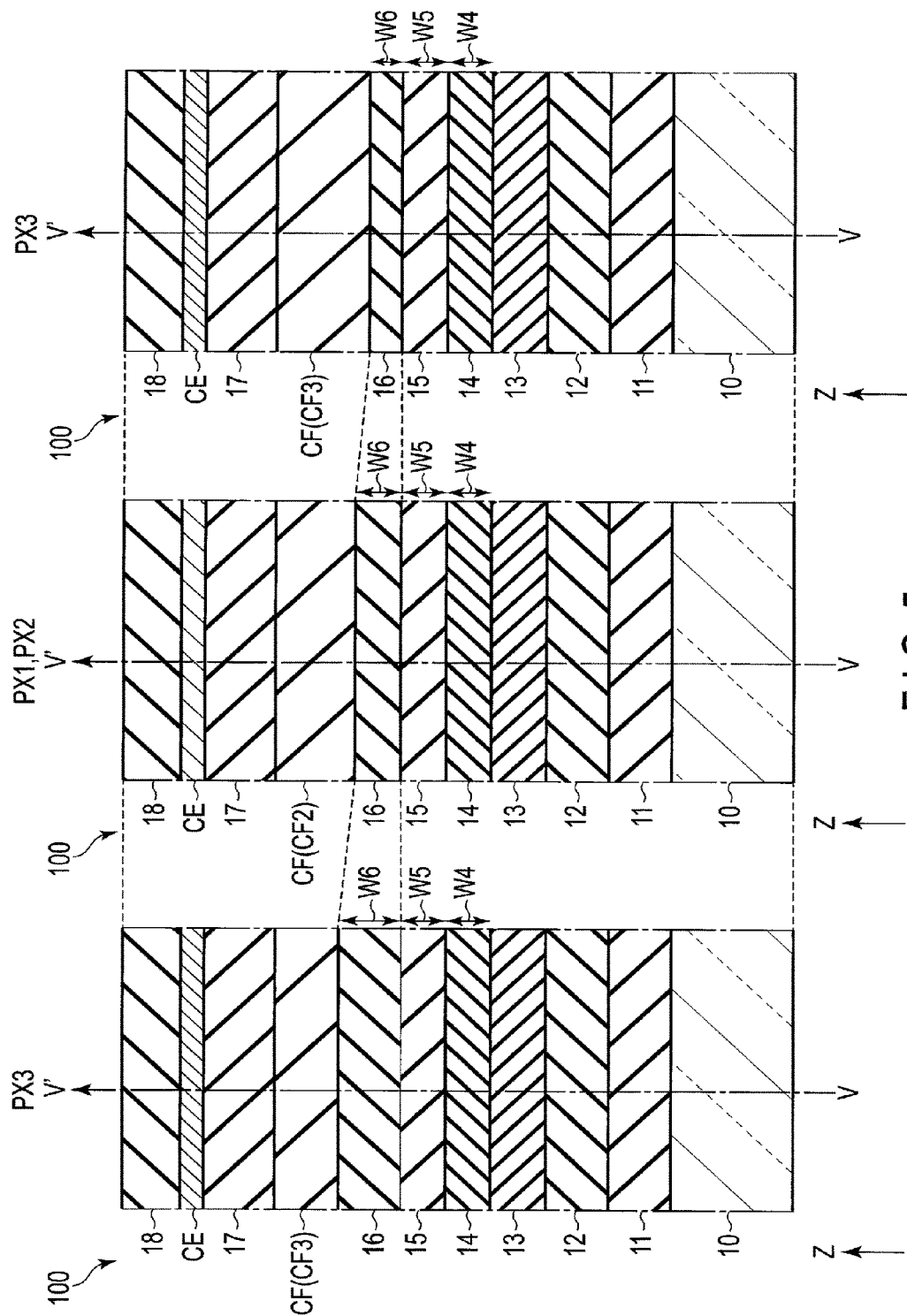
F I G. 5

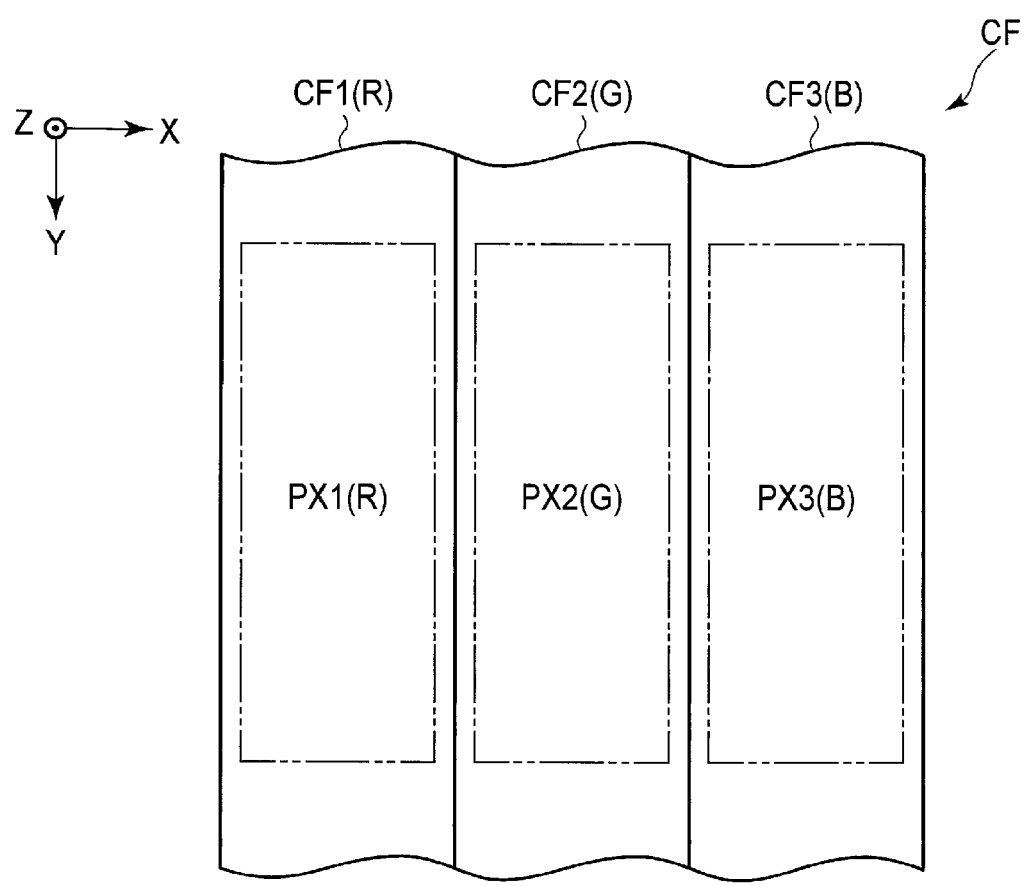
F I G. 11

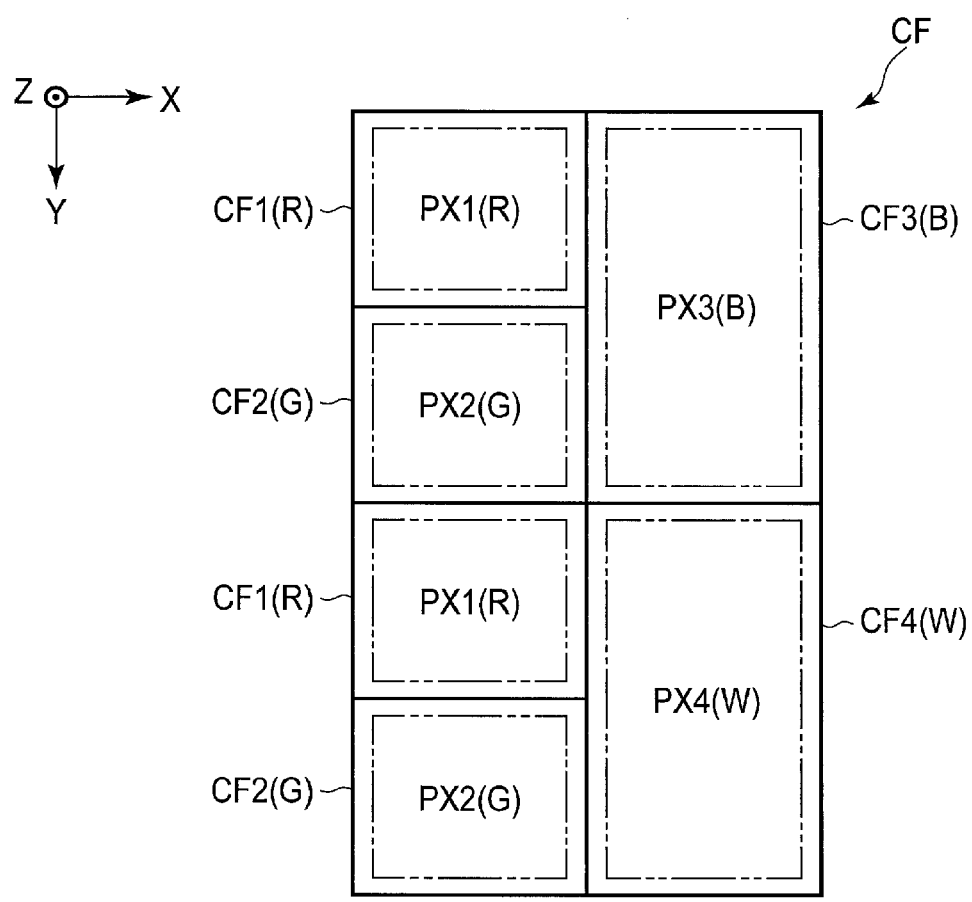
F I G. 12

PATENT

SEMICONDUCTOR DEVICE HAVING MULTIPLE INSULATING FILMS OF VARYING THICKNESS

CROSS-REFERENCE TO RELATED APPLICATIONS

This application is based upon and claims the benefit of priority from Japanese Patent Application No. 2016-006120, filed Jan. 15, 2016, the entire contents of which are incorporated herein by reference.

FIELD

Embodiments described herein relate generally to a semiconductor device.

BACKGROUND

In recent years, liquid crystal display devices include a structure in which a color filter layer is disposed in an array substrate with pixel switching elements and pixel electrodes disposed thereon in order to suppress degradation of color purity by color mixing. In some cases, an interference filter is used for the color filter layer.

BRIEF DESCRIPTION OF THE DRAWINGS

FIG. 3 is a sectional view of the display device of the embodiment.

FIG. 5 is a sectional view of each layer along line V-V' of FIG. 4.

FIG. 11 shows a first arrangement of a color filter layer.

FIG. 12 shows a second arrangement of the color filter layer.

DETAILED DESCRIPTION

Figure 1:
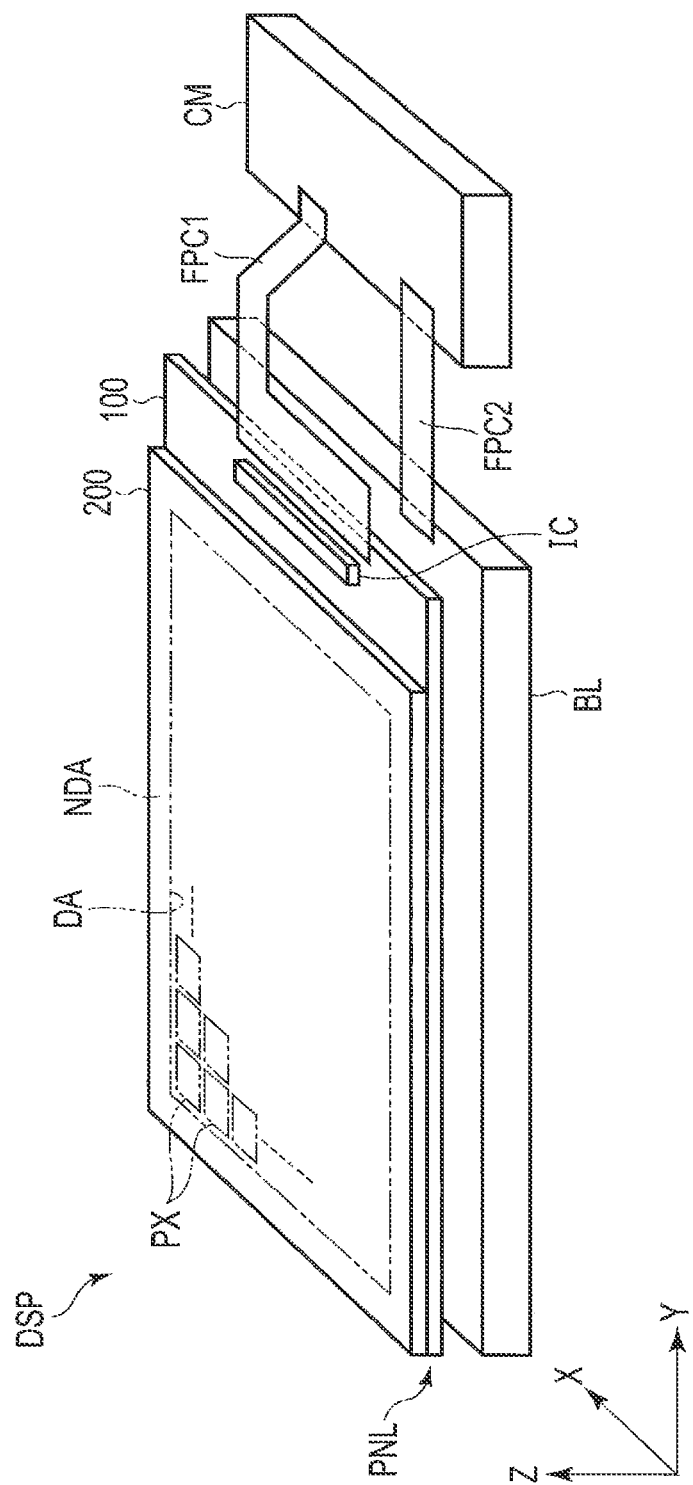
FIG. 1 shows the structure of a display device of an embodiment.

In general, according to one embodiment, a display device includes: an insulating substrate; a first insulating film disposed on the insulating substrate; a second insulating film disposed on the first insulating film; a third insulating film disposed on the second insulating film; a fourth insulating film disposed on the third insulating film; a fifth insulating film disposed on the fourth insulating film; a sixth insulating film disposed on the fifth insulating film; a color filter layer disposed on the sixth insulating film; a semiconductor layer disposed between the second insulating film and the third insulating film; a gate electrode disposed between the third insulating film and the fourth insulating film; and a source electrode disposed between the fifth insulating film and the sixth insulating film and electrically connected to the semiconductor layer, wherein the first, fourth, and sixth insulating films are formed of a silicon nitride, and the second, third, and fifth insulating films are formed of a silicon oxide.

Embodiments will be described hereinafter with reference to the accompanying drawings. Incidentally, the disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc. of the respective parts are schematically illustrated in the drawings, compared to the actual modes. However, the schematic illustration is merely an example, and adds no restrictions to the interpretation of the invention. Besides, in the specification and drawings, the structural elements having functions, which are identical or similar to the functions of the structural elements described in connection with preceding drawings, are denoted by like reference numerals, and an overlapping detailed description is omitted unless necessary.

FIG. 1 shows the structure of a display device of the present embodiment.

In the present embodiment, a first direction X is, for example, a direction of the short sides of a display panel PNL. A second direction Y is a direction orthogonal to the first direction X which is a direction of the long sides of the display panel PNL. A third direction Z is a direction orthogonal to both the first and second directions X and Y.

Note that the present embodiment will be explained with reference to the figures of the display device including a liquid crystal display panel which controls its display with liquid crystal molecules; however, no limitation is intended thereby. The present embodiment can be applied to, for example, a display device including a mechanical display panel which controls its display by micro mechanical system (MEMS) shutter or to a display device including an electronic paper display panel which includes electrophoresis devices. Note that, if a MEMS shutter is used, a first polarizer PL1 and a second polarizer PL2 which will be described later may be omitted.

The display device DSP includes, for example, a display panel PNL, driver IC chip IC which drives the display panel PNL, illumination device (backlight unit) BL which illuminates the display panel PNL, control module CM which controls functions of the display panel PNL and the illumination device BL, and flexible printed circuits FPC1 and FPC2 which transmit control signals to the display panel PNL and the illumination device BL.

The display panel PNL includes a first substrate 100, second substrate 200 which is opposed to the first substrate 100, and liquid crystal layer (liquid crystal layer LQ which will be described later) held between the first substrate 100 and the second substrate 200. The display panel PNL includes a display area DA used for image displaying and a frame-like non-display area NDA disposed around the display area DA. In the example depicted, the display area DA is formed in a quadrangle; however, it may be formed in a different polygonal shape, or in any other shapes such as a circle or an ellipse.

The illumination device BL is disposed in the lower surface side of the display panel PNL which is opposed to the first substrate 100. The illumination device BL may be materialized in various models, and it may be of vertical alignment type in which light emitting devices such as light emitting diodes (LEDs) are disposed in a plane which is parallel to the main surface or may be of edge type in which light emitting devices are disposed in edges of a lightguide plate which is not shown. The driver IC chip IC is mounted on the first substrate 100 disposed in one of the short sides. The flexible printed circuit FPC1 is mounted on the first substrate 100 in the driver IC chip IC side to connect the display panel PNL and the control module CM. The flexible printed circuit FPC2 connects the illumination device BL and the control module CM.

The display device DSP is a transmissive liquid crystal display device including a transmissive function which displays an image by selectively passing light incident on the display panel PNL from the illumination device BL into each pixel PX. However, the display device DSP may be a transflective liquid crystal display device including both the transmissive display function and a reflective display function which displays an image by selectively reflecting external light incident onto the display panel PNL at each pixel PX. In such a transflective liquid crystal display device, an illumination device (frontlight unit) may be disposed in the upper surface side of the display panel PNL which is opposed to the second substrate 200. The following description will be given to a case where the display device DSP is a transmissive liquid crystal display device.

Figures 2, 6:
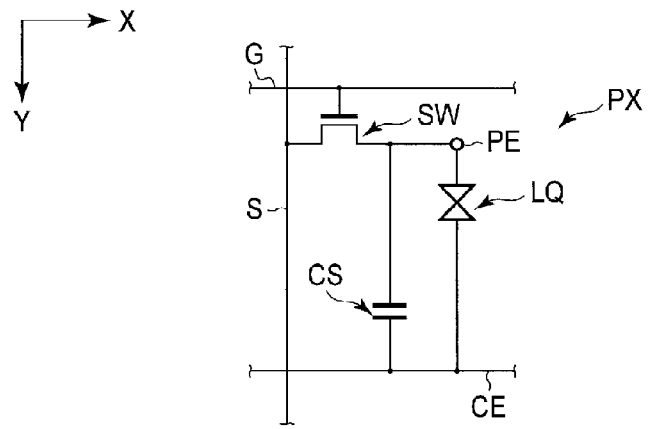
FIG. 2 shows the structure of a pixel.
FIG. 6 shows a table of evaluation results of the transmissivity of the display panel where a fourth thickness and a fifth thickness are changed.

FIG. 2 shows the structure of a pixel.

Each pixel PX includes, for example, a switching element SW, pixel electrode PE, common electrode CE, and liquid crystal layer LQ. The switching element SW is formed of a thin film transistor (TFT). The switching element SW is electrically connected to a scan line G, signal line S, and pixel electrode PE. For example, the scan line G extend in the first direction X and the signal line S extends in the second direction Y. Note that the scan line G and the signal line S may be formed linearly or may partly be bent. The liquid crystal layer LQ is driven by a field produced between the pixel electrode PE and the common electrode CE. A capacitance CS is formed between the common electrode CE and the pixel electrode PE.

FIG. 3 is a sectional view of the display device of the present embodiment.

FIG. 3 schematically shows the structure of the display panel PNL in relation to pixels PX1, PX2, and PX3 in a sectional view. The first substrate 100, second substrate 200, liquid crystal layer LQ, and optical devices OD1 and OD2 will be explained one by one with reference to FIG. 3. Note that the display panel PNL corresponds to a horizontal field display mode which uses a horizontal field with respect to the main surfaces of the substrates. That is, although this is not depicted in FIG. 3, the display panel PNL includes both the pixel electrodes PE and the common electrode CE in the first substrate 100. However, the display mode of the display panel PNL is not limited thereto, and it may be a display mode which uses a vertical field with respect to the substrate main surfaces, or a display mode which uses an inclined field with respect to the substrate main surfaces, or a display mode which uses a combination of the above fields. In a display mode using a vertical field or an inclined field, a structure where the first substrate 100 includes pixel electrodes PE and the second substrate 200 includes the common electrode CE can be applied.

In the following description, up (above) is, for example, the direction Z going from the first substrate 100 side to the second substrate 200 side.

The first substrate 100 includes, for example, an insulating substrate 10, switching element SW, color filter layer CF, and alignment film AL1.

The insulating substrate 10 is formed of a light transmissive insulating material such as glass or resin. The switching element SW is disposed above the insulating substrate 10. The switching elements SW are disposed to be apart from one another, and arranged in both the first and second directions X and Y. The color filter layers CF are disposed above the insulating substrate 10 and the switching elements SW.

The alignment film AL1 is disposed above the color filter layers CF.

The color filter layers CF include a color filter layer CF1 in an area corresponding to pixel PX1. For example, the color filter layer CF1 is a red (R) color filter layer which passes red light and pixel PX1 is a red (R) pixel. Similarly, the color filter layers CF include a color filter layer CF2 in an area corresponding to pixel PX2 and a color filter layer CF3 in an area corresponding to pixel PX3. For example, the color filter CF2 is a green (G) color filter layer and pixel PX2 is a green (G) pixel and the color filter layer CF3 is a blue (B) color layer and pixel PX3 is a blue (B) pixel. The color filter layers CF1, CF2, and CF3 are, for example, aligned in the first direction X and an end of each color filter layer is opposed to, for example, a switching element SW.

The color filter layers CF1, CF2, and CF3 are, for example, formed of resins of red (R), green (G), and blue (B), respectively. A coloring material for such a resin is not limited, and it may be a pigment or a dye. If a pigment is used, color filter layers CF of good durability can be obtained. If a dye is used, color filter layers CF of good light transmissivity can be obtained, and luminosity of pixels PX can be increased. Note that the colors of the color filter layers CF are not limited, and color filter layers of different colors such as white (non-color) may be used arbitrarily.

The second substrate 200 includes, for example, an insulating substrate 20, light shielding layer SH, overcoat layer OC, spacer SP, and alignment film AL2.

The insulating substrate 20 is formed of a light transmissive insulating material such as glass or resin. The light shielding layer SH is disposed in the lower surface side of the second insulating substrate 20. The pixel PX includes an aperture AP in an area surrounded by the light shielding layer SH. The overcoat layer OC is disposed in the lower surface side of the insulating substrate 20 to cover the light shielding layer SH. The spacer SP is disposed in the lower surface side of the overcoat layer OC to project downwardly. The spacer SP is disposed in, for example, an area opposed to the light shielding layer SH. The spacers SP define a gap between the first substrate 100 and the second substrate 200. The spacer SP may be formed of the same material used for the overcoat layer OC. The overcoat layer OC and the spacers SP may be formed continuously.

The alignment film AL2 is, for example, disposed below the overcoat layer OC to cover the spacers SP. The alignment films AL1 and AL2 are horizontal alignment films or vertical alignment films arbitrarily selected to conform to the display mode of the liquid crystal display device. For example, if the display device DSP is of horizontal field mode, the alignment films AL1 and AL2 are formed of an organic material of horizontal alignment such as polyimide, and are subjected to a rubbing treatment or an optical alignment treatment.

The liquid crystal layer LQ is held between the first substrate 100 and the second substrate 200. Liquid crystal molecules LM in the liquid crystal layer LQ are, in a state where no field is produced in the liquid crystal layer LQ, for example, under an alignment restriction force from the alignment films AL1 and AL2 and are initially aligned in a direction parallel to the main surfaces of the first substrate 100 and the second substrate 200.

An optical element OD1 is disposed between the liquid crystal layer LQ and the illumination device BL. An optical element OD2 is disposed above the liquid crystal layer LQ. In the example depicted, the optical element OD1 is disposed on the lower surface of the insulating substrate 10 and the optical element OD2 is disposed on the upper surface of the insulating substrate 20. The optical element OD1 includes the first polarizer PL1 and the optical element OD2 includes the second polarizer PL2. The first and second polarizers PL1 and P12 are arranged such that their absorption axes are orthogonal to each other. Note that the optical elements OD1 and OD2 may include other function layers such as a phase differentiation plate and a surface treatment layer.

Next, the detailed structure of the first substrate 100 will be explained.

Figure 4:
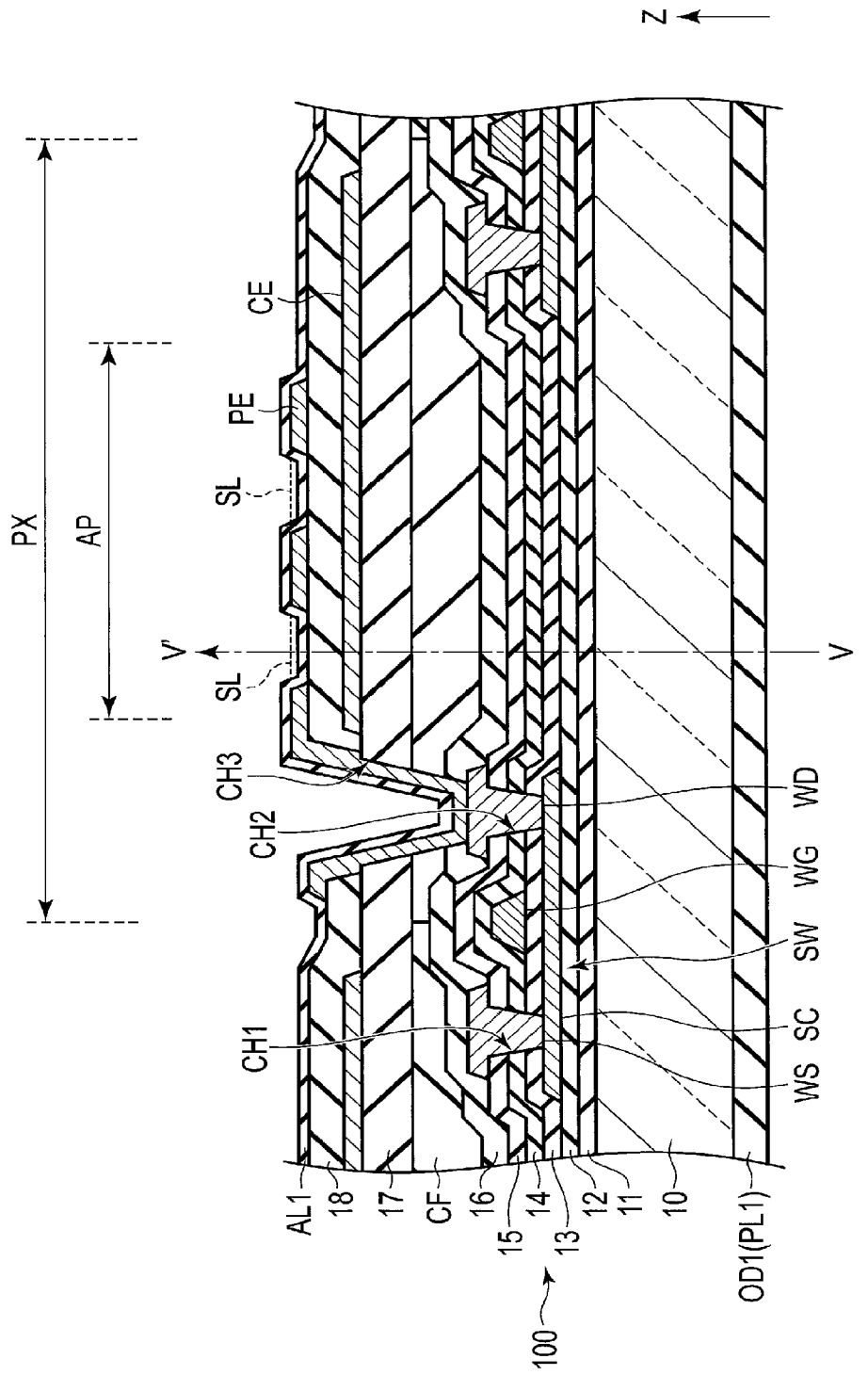
FIG. 4 is a sectional view of a first substrate.

FIG. 4 is a sectional view of the first substrate.

The first substrate 100 includes, above the insulating substrate 10, insulating films 11, 12, 13, 14, 15, 16, 17, and 18, semiconductor layer SC, gate electrode WG, source electrode WS, drain electrode WD, common electrode CE, and pixel electrode PE. Note that, in the example depicted, the switching element SW is a single gate structure top-gate thin film transistor; however, it may be of double gate structure or may be a bottom-gate thin film transistor.

The insulating film 11 is disposed on the insulating substrate 10. The insulating film 12 is disposed on the insulating film 11. The insulating film 13 is disposed on the insulating film 12. The insulating film 14 is disposed on the insulating film 15. The insulating film 16 is disposed on the insulating film 15. The color filter layer CF is disposed on the insulating film 16. The insulating film 17 is disposed on the color filter layer CF. The insulating film 18 is disposed on the insulating film 17. The semiconductor layer SC is disposed between the insulating film 12 and the insulating film 13. The gate electrode WG is disposed between the insulating film 13 and the insulating film 14 and is opposed to the semiconductor layer SC. The source electrode WS and the drain electrode WD are disposed between the insulating film 15 and the insulating film 16. The source electrode WS is electrically connected to the semiconductor layer SC through a contact hole CH1 passing through the insulating films 13, 14, and 15. The drain electrode WD is electrically connected to the semiconductor layer SC through a contact hole CH2 passing through the insulating films 13, 14, and 15. The common electrode CE is disposed between the insulating film 17 and the insulating film 18. The pixel electrode PE is disposed on the insulating film 18 and is opposed to the insulating film 18 in an area corresponding to the aperture AP. The pixel electrode PE is electrically connected to the drain electrode WD through a contact hole CH3 passing through the insulating films 16, 17, and 18 and the color filter layer CF. In the area corresponding to the aperture AP, one or more slits SL are formed in the pixel electrode PE.

The insulating films 11 to 17 are formed of an insulating material. The insulating films 11, 14, and 16 are formed of a silicon nitride (SiN). The insulating films 12, 13, and 15 are formed of silicon oxide (SiO). The insulating film 17 is formed of an organic insulating material such as acrylic resin. The common electrode CE and the pixel electrode PE are formed of a transparent conductive material such as indium tin oxide (ITO) or indium zinc oxide (IZO).

The first substrate 100 is formed on the insulating substrate 10 by laminating layers thereon one by one. The color filter layer CF and the insulating film 17 which are organic material layers are formed through a wet process. The insulating films 11 to 16, and 18, semiconductor layer SC, gate electrode WG, source electrode WS, drain electrode WD, common electrode CE, and pixel electrode PE which are inorganic material layers are formed through a dry process. In the dry process, the first substrate 100 is heated above 200° C., for example. Thus, the color filter layer CF which is an organic material layer may be damaged by the heat when forming the common electrode CE, insulating film 18, and pixel electrode PE.

Line V-V' is an example of a light path of the light from the illumination device EL passing through the display panel PNL. Line V-V' is in a direction parallel to the third direction Z. Next, the thickness of each insulating film in the third direction Z will be explained.

FIG. 5 is a sectional view of each layer along line V-V' of FIG. 4.

The light incident from the below of the first substrate 100 passes through the layered structure of thin films in the figure. In such a layered structure, if refractive indices of thin films contacting each other are different, a light interference effect by interface reflection will occur. Thus, transmissivity distribution of light passing through thin films of the layered structure has peaks and valleys. In the present embodiment, the thickness of each film is optimized to suppress decrease of transmissivity by the interference.

In order to suppress impurities entering the semiconductor layer SC from the insulating substrate 10, the insulating film 11 is, preferably, set to approximately 150 nm, and the insulating film 12 is, preferably, set to approximately 170 nm. The insulating film 13 is, preferably, set to 80 to 100 nm since it effects the performance of the switching element SW. Thickness W4 of the insulating film 14 and thickness W5 of the insulating film 15 may be determined arbitrarily. However, in order to avoid to form the contact holes CH1 and CH2 unnecessarily deep, the sum of the thicknesses W4 and W5 is, preferably, set below 1000 nm. Note that, in order to allow the insulating films 14 and 15 to achieve sufficient insulating performance, the thicknesses W4 and W5 is, preferably, set to 400 nm or more, and more preferably, set to 500 nm or more. Thickness W6 of the insulating film 16 is arbitrarily determined. The color filter layer CF is, preferably, set to 1.5 to 2.5 μm in order to obtain good transmissivity and hue. The insulating film 17 is, preferably, set to approximately 4 μm in order to make its upper surface flat. The common electrode CE is, preferably, set to approximately 80 nm in order to obtain good transparency and conductivity. The insulating film 18 is, preferably, set to 130 to 150 nm since the insulating film 18 controls the capacitance produced between the common electrode CE and the pixel electrode PE.

From the above, inventors found a condition to achieve high transmissivity using the thicknesses W4, W5, and W6 as parameters. Note that the thickness W6 in an area opposed to the color filter layer CF1 may be different from the thickness W6 in an area opposed to the color filter layer CF3. Here, if the thicknesses W6 in areas opposed to color filter layers CF1, CF2, and CF3 are all different, the control of thicknesses W6 becomes difficult. Thus, if the thickness W6 in the area opposed to the color filter layer CF1 and the thickness W6 in the area opposed to the color filter layer CF3 are different, the thickness W6 in an area opposed to the color filter layer CF2 is, preferably, set to be equal to the thickness W6 in the area opposed to the color filter layer CF1 or the thickness W6 in the area opposed to the color filter layer CF3. For example, the thickness W6 in the area opposed to a red color filter layer is equal to the thickness W6 in the area opposed to a green color filter layer and is different from the thickness W6 in the area opposed to a blue color filter layer.

The insulating film 16 having different thicknesses W6 in different areas as above can be formed by patterning a photoresist with a half-tone mask and etching it with the photoresist as a mask. Through this manufacturing method, the insulating film 16 can be formed without increasing a manufacturing process. Or, as a different manufacturing method, the insulating film 16 may be formed twice and etched twice. Through this manufacturing method, the insulating film 16 of highly accurate thicknesses can be formed.

FIG. 6 shows a table of evaluation results of the transmissivity of the display panel where a fourth thickness and a fifth thickness are changed.

Here, the transmissivity of light taken along line V-V' is calculated by simulation when thicknesses W4 and W5 are in ranges in the table. Note that the transmissivity simulation is performed with respect to red (R) light, green (G) light, and blue (B) light. In the following description, red, green, and blue may be referred to as R, G, and B, respectively. In the transmissivity simulation of R, the color filter layer CF is a red color filter layer and light wavelength incident on the display panel PNL is set to 650 nm. In the transmissivity simulation of G, the color filter layer CF is a green color filter layer and light wavelength incident on the display panel PNL is set to 550 nm. In the transmissivity simulation of B, the color filter layer CF is a blue color filter layer and light wavelength incident on the display panel PNL is set to 450 nm.

As an example of the specification required to the display panel PNL, the transmissivity of R, G, and B is, preferably, 85% or more. Thus, under a condition where the thicknesses W6 are practically usable, the thicknesses W6 are, preferably, set such that the transmissivity of at least two colors of R, G, and B becomes 85% or more. In this example, a practical range of the thicknesses W6 is 10 to 400 nm. That is, to achieve the insulating film 16 with a sufficient insulating ability, the thickness W6 is 10 nm or more. On the other hand, since the insulating film 16 is formed through chemical vapor deposition (CVD) or the like, the thickness W6 is required to be 400 nm or less to avoid a long manufacturing period.

Furthermore, the transmissivity of B is sensitive to a change of the thickness W6 and the transmissivity distribution of B with respect to the thickness W6 has a great difference between its peak value and its valley value. Thus, in order to control varying transmissivity in blue pixels caused by a tolerance of the thickness W6, an amplitude of the transmissivity spectrum of B with respect to the thickness W6 is, preferably, smaller, and a difference between the peak value and the valley value in the transmissivity distribution of B with respect to the thickness W6 is, preferably, below 0.35 (35%). Furthermore, as described above, the thicknesses W6 in the areas corresponding to the color filter layers of R, G, and B should not be all different from each other.

Thus, the results of the simulation were evaluated as follows. That is, when the thicknesses W6 are the same value while the transmissivity of each of R, G, and B is 85% or more, and the value is 10 to 400 nm, OK1 was given.

When the thicknesses W6 are two different values while the transmissivity of two of R, G, and B is 85% or more and the transmissivity of the remaining color is 85% or more, and the values are 10 to 400 nm, OK2 was given.

When the thicknesses W6 are 10 to 400 nm, and a peak value of the transmissivity of at least one color of R, G, and B is below 85%, NG1 was given.

When the thicknesses W6 are 10 to 400 nm, and a value of the thickness W6 in which the transmissivity of R reaches its peak, a value of the thickness W6 in which the transmissivity of G reaches its peak, and a value of the thickness W6 in which the transmissivity of B reaches its peak are different from each other, NG2 was given.

When the thicknesses W6 are 10 to 400 nm, and a difference between the peak value and the valley value of the transmissivity of B was 0.35 (35%) or more, NG3 was given.

Initially, an evaluation result when the thickness W4 was 300 nm or more and less than 350 nm will be explained. Here, the evaluation result was NG2 if the thickness W5 was 300 nm or more and less than 350 nm. Furthermore, if the thickness W5 was 350 nm or more and less than 400 nm, the evaluation result was NG3. If the thickness W5 was 400 nm or more and less than 450 nm, the evaluation result was OK2. Furthermore, if the thickness W5 was 450 nm or more and less than 500 nm, the evaluation result was NG1.

Then, an evaluation result when the thickness W4 was 350 nm or more and less than 400 nm will be explained. Here, the evaluation result was NG1 if the thickness W5 was 300 nm or more and less than 350 nm. Furthermore, if the thickness W5 was 350 nm or more and less than 400 nm, the evaluation result was OK1. If the thickness W5 was 400 nm or more and less than 450 nm, the evaluation result was OK1. Furthermore, if the thickness W5 was 450 nm or more and less than 500 nm, the evaluation result was NG1.

Then, an evaluation result when the thickness W4 was 400 nm or more and less than 450 nm will be explained. Here, the evaluation result was NG1 if the thickness W5 was 300 nm or more and less than 350 nm. Furthermore, if the thickness W5 was 350 nm or more and less than 400 nm, the evaluation result was NG3. If the thickness W5 was 400 nm or more and less than 450 nm, the evaluation result was OK1. Furthermore, if the thickness W5 was 450 nm or more and less than 500 nm, the evaluation result was NG2.

Lastly, an evaluation result when the thickness W4 was 400 nm or more and less than 450 nm will be explained. Here, the evaluation result was NG1 if the thickness W5 was 300 nm or more and less than 350 nm. Furthermore, if the thickness W5 was 350 nm or more and less than 400 nm, the evaluation result was OK2. If the thickness W5 was 400 nm or more and less than 450 nm, the evaluation result was NG1. Furthermore, if the thickness W5 was 450 nm or more and less than 500 nm, the evaluation result was NG1.

As can be understood from the above, if the thickness W5 is 350 nm or more and less than 450 nm, the thickness W4 and thickness W6 of certain values may give OK1 or OK2. Furthermore, if the thickness W4 is 300 nm or more and less than 500 nm, the thickness W5 and thickness W6 of certain values may give OK1 or OK2. Furthermore, if the thickness W4 is 350 nm or more and less than 450 nm, the thickness W5 and thickness W6 of certain values may give OK1.

Now, with reference to FIGS. 7 to 10, an example of the transmissivity spectrum with respect to the thickness W6 when the thicknesses W4 and W5 are in the value ranges will be explained. In FIGS. 7 to 10, the transmissivity spectrum of R is depicted in solid lines, the transmissivity spectrum of G is depicted in broken lines, and the transmissivity spectrum of B is depicted in dotted lines. In each graph, the horizontal axis shows the size of thickness W6, and the unit is μm. Furthermore, the vertical axis shows the transmissivity which is the strength of light passing through the display panel PNL when the strength of light before being incident on the display panel PNL is (100%). In each graph, a horizontal line showing a border between OK and NG is drawn at 0.85 in the vertical axis.

Figure 7:
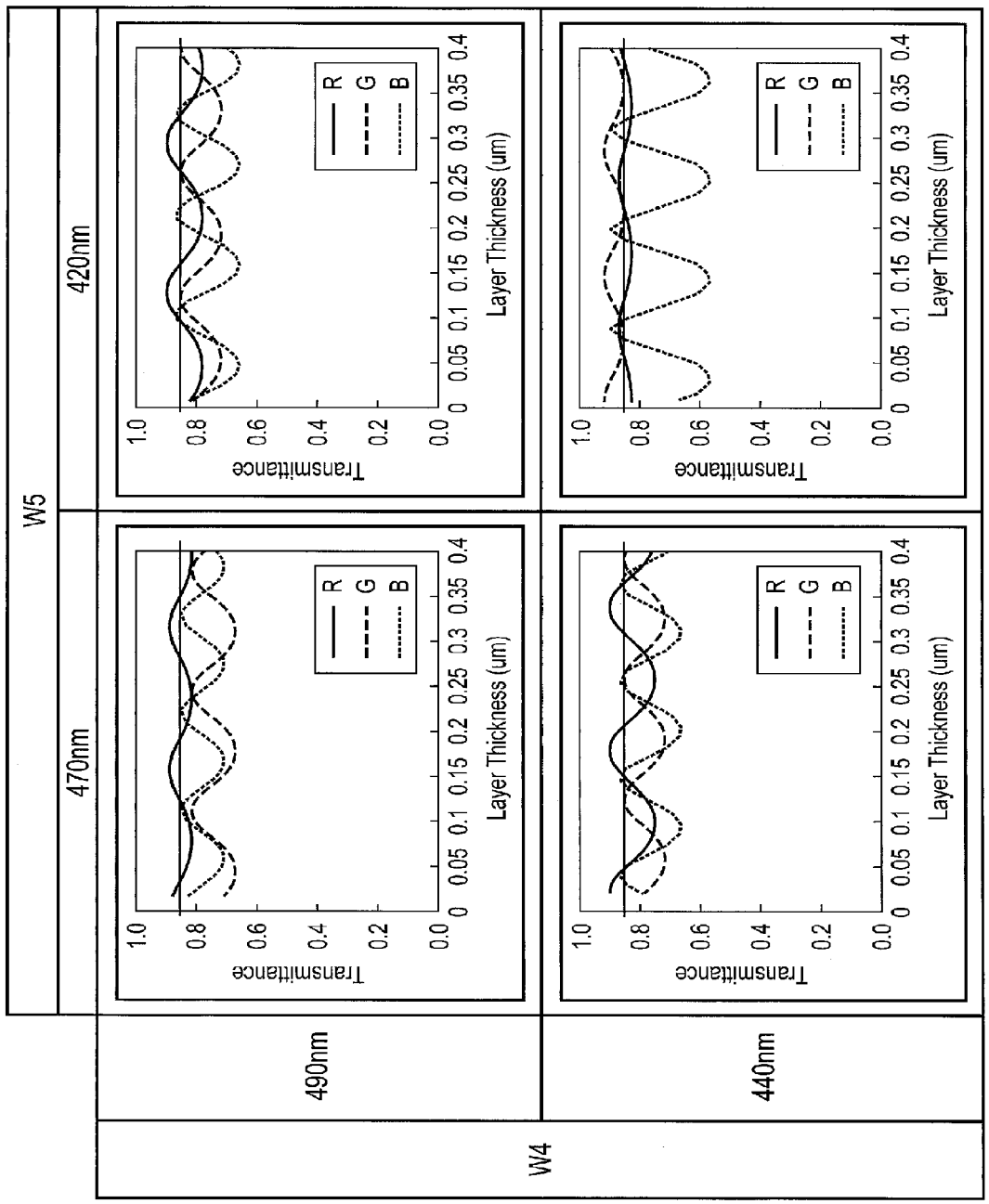
FIG. 7 shows an example of a transmissivity graph where a fifth thickness is 400 to 500 nm and a fourth thickness is 400 to 500 nm.

FIG. 7 shows an example of the transmissivity graph where the fifth thickness is 400 to 500 nm, and the fourth thickness is 400 to 500 nm.

FIG. 7 shows four graphs. First graph shows the transmissivity spectrum where W4 is 440 nm and W5 is 420 nm. Second graph shows the transmissivity spectrum where W4 is 440 nm and W5 is 470 nm. Third graph shows the transmissivity spectrum where W4 is 490 nm and W5 is 420 nm. Fourth graph shows the transmissivity spectrum where W4 is 490 nm and W5 is 470 nm.

If W4 is 440 nm and W5 is 420 nm, the transmissivity of all R, G, and B becomes 85% when W6 is 90 nm, and the evaluation result is OK1. Furthermore, the transmissivity of G where W6 is 90 nm reaches its valley value, in order to increase the transmissivity of G, the thickness W6 of the insulating film 16 in the area opposed to the green color filter layer may be 150 nm or 280 nm where the transmissivity of G reaches its peak value. In that case, the evaluation result is OK2, and since a change in the thickness W6 is preferably small in order to increase the accuracy of the formation of the insulating film 16, the thickness W6 in the area opposed to the red color filter layer is, preferably, set to 90 nm and the thickness W6 in the area opposed to the green color filter layer is, preferably, set to 150 nm.

If W4 is 440 nm and W5 is 470 nm, the values of the thicknesses W6 where each transmissivity of R, G, and B are all different, and thus, the evaluation result is NG2.

If W4 is 490 nm and W5 is 420 nm, the peak value of the transmissivity of G is less than 0.85, and thus, the evaluation result is NG1.

If W4 is 490 nm and W5 is 470 nm, the peak values of the transmissivity of each of G and B is less than 0.85, and thus, the evaluation result is NG1.

Figure 8:
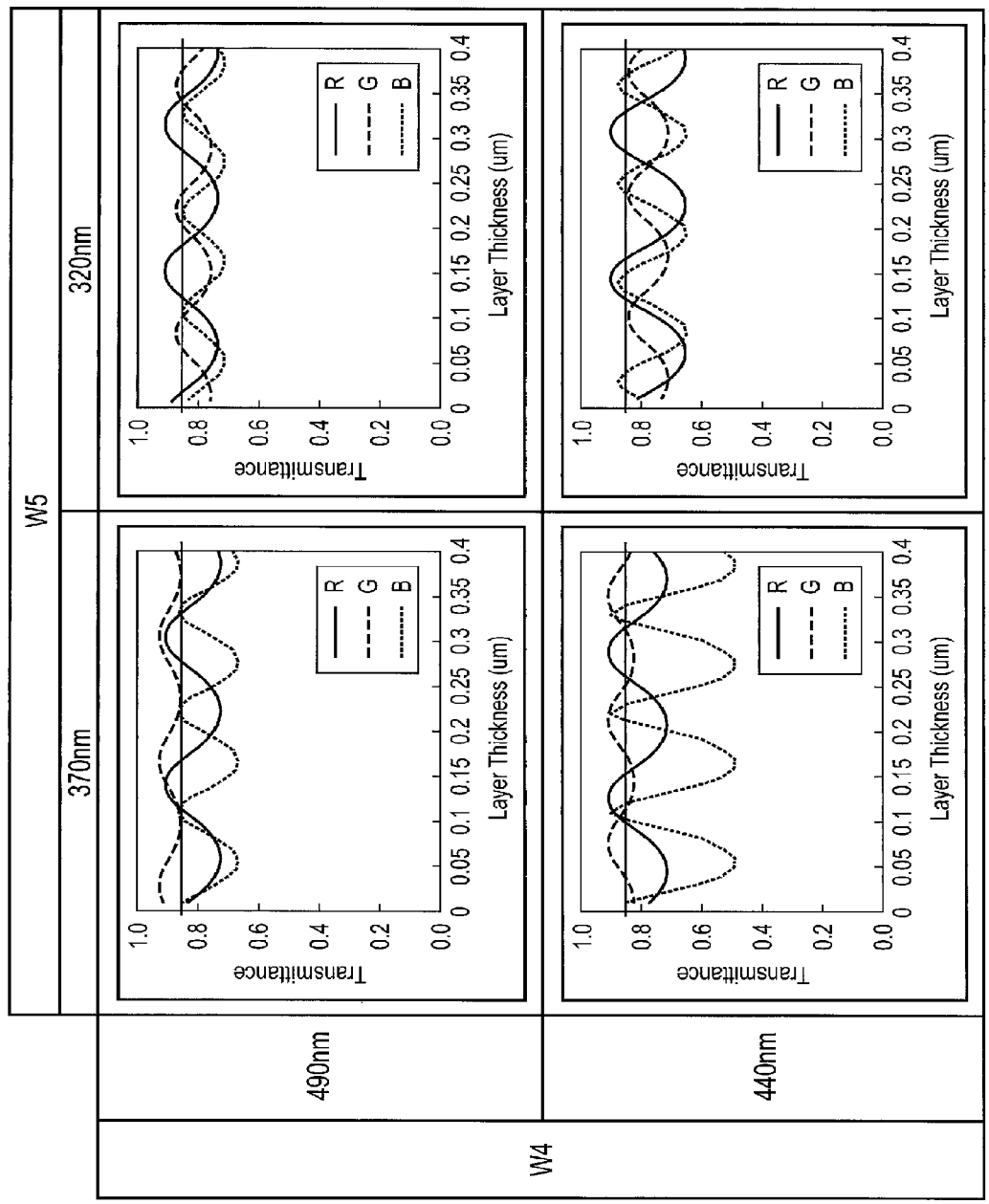
FIG. 8 shows an example of a transmissivity graph where a fifth thickness is 300 to 400 nm and a fourth thickness is 400 to 500 nm.

FIG. 8 shows an example of the transmissivity graph where the fifth thickness is 300 to 400 nm, and the fourth thickness is 400 to 500 nm.

FIG. 8 shows four graphs. First graph shows the transmissivity spectrum where W4 is 440 nm and W5 is 320 nm. Second graph shows the transmissivity spectrum where W4 is 440 nm and W5 is 370 nm. Third graph shows the transmissivity spectrum where W4 is 490 nm and W5 is 320 nm. Fourth graph shows the transmissivity spectrum where W4 is 490 nm and W5 is 370 nm.

If W4 is 440 nm and W5 is 320 nm, the peak value of the transmissivity of G is less than 0.85, and thus, the evaluation result is NG1.

If W4 is 440 nm and W5 is 370 nm, a difference between the peak value and the valley value of the transmissivity of B is approximately 0.40, and thus, the evaluation result is NG3.

If W4 is 490 nm and W5 is 320 nm, the peak value of the transmissivity of B is less than 0.85, and thus, the evaluation result is NG1.

If W4 is 490 nm and W5 is 370 nm, the transmissivity of each of R and G is 85% or more when W6 is 300 nm and the transmissivity of B becomes 85% or more when W6 is 110, 220, and 330 nm, and the evaluation result is OK2. Here, since a change in the thickness W6 is preferably small in order to increase the accuracy of the formation of the insulating film 16, the thickness W6 in the area opposed to the red color filter layer is, preferably, set to 300 nm and the thickness W6 in the area opposed to the blue color filter layer is, preferably, set to 220 or 330 nm.

Figure 9:
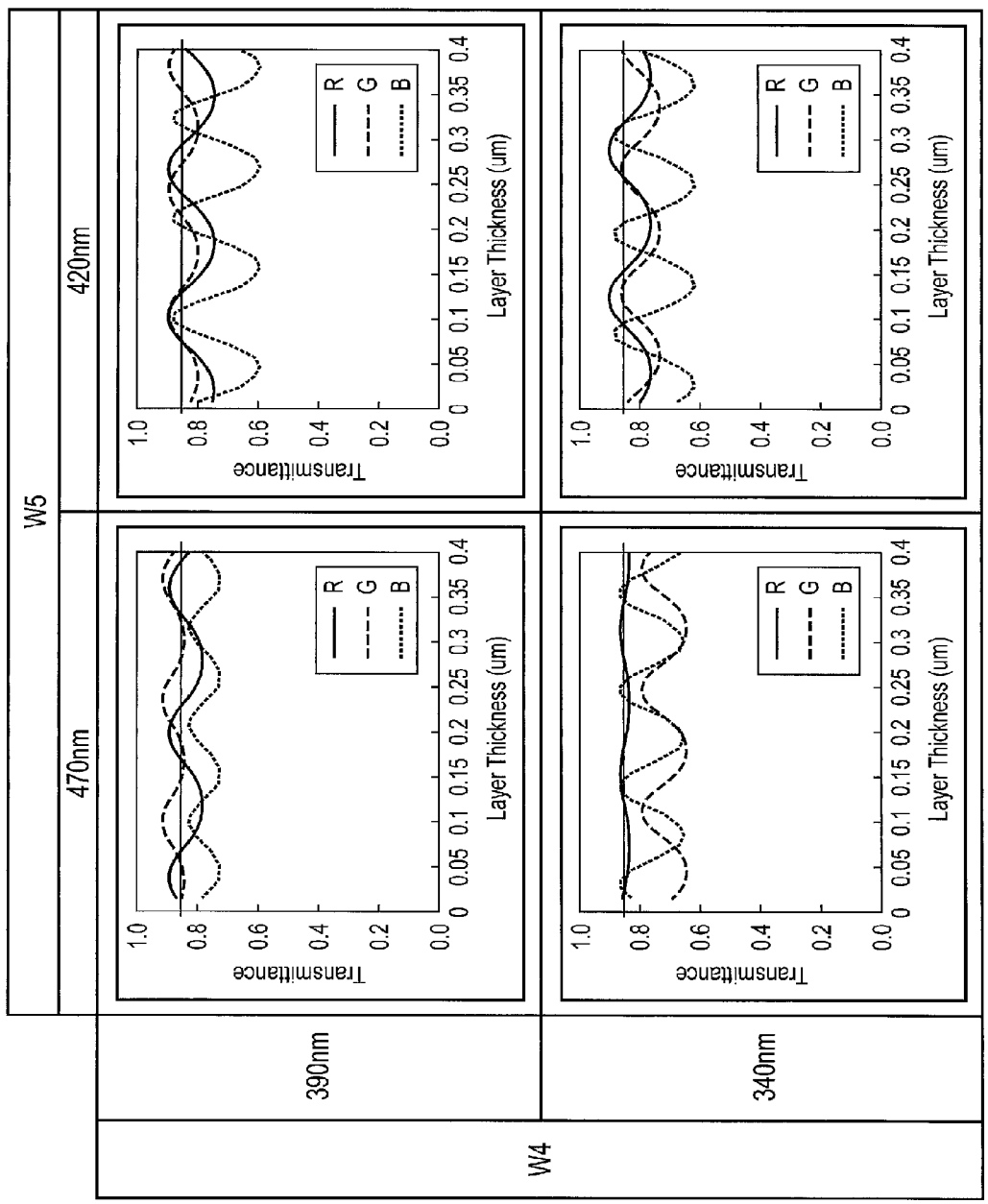
FIG. 9 shows an example of a transmissivity graph where a fifth thickness is 400 to 500 nm and a fourth thickness is 300 to 400 nm.

FIG. 9 shows an example of the transmissivity graph where the fifth thickness is 400 to 500 nm, and the fourth thickness is 300 to 400 nm.

FIG. 9 shows four graphs. First graph shows the transmissivity spectrum where W4 is 340 nm and W5 is 420 nm. Second graph shows the transmissivity spectrum where W4 is 340 nm and W5 is 470 nm. Third graph shows the transmissivity spectrum where W4 is 390 nm and W5 is 420 nm. Fourth graph shows the transmissivity spectrum where W4 is 390 nm and W5 is 470 nm.

If W4 is 340 nm and W5 is 420 nm, the transmissivity of each of R and G is 85% or more when W6 is 130 nm and the transmissivity of B becomes 85% or more when W6 is 90, 200, and 310 nm, and the evaluation result is OK2. Here, since a change in the thickness W6 is preferably small in order to increase the accuracy of the formation of the insulating film 16, the thickness W6 in the area opposed to the red color filter layer is, preferably, set to 130 nm and the thickness W6 in the area opposed to the blue color filter layer is, preferably, set to 90 or 200 nm.

If W4 is 340 nm and W5 is 470 nm, the peak value of the transmissivity of G is less than 0.85, and thus, the evaluation result is NG1.

If W4 is 390 nm and W5 is 420 nm, the transmissivity of all R, G, and B becomes 85% or more when W6 is 100 nm, and thus, the evaluation result is OK1.

If W4 is 390 nm and W5 is 470 nm, the peak value of the transmissivity of G is less than 0.85, and thus, the evaluation result is NG1.

Figure 10:
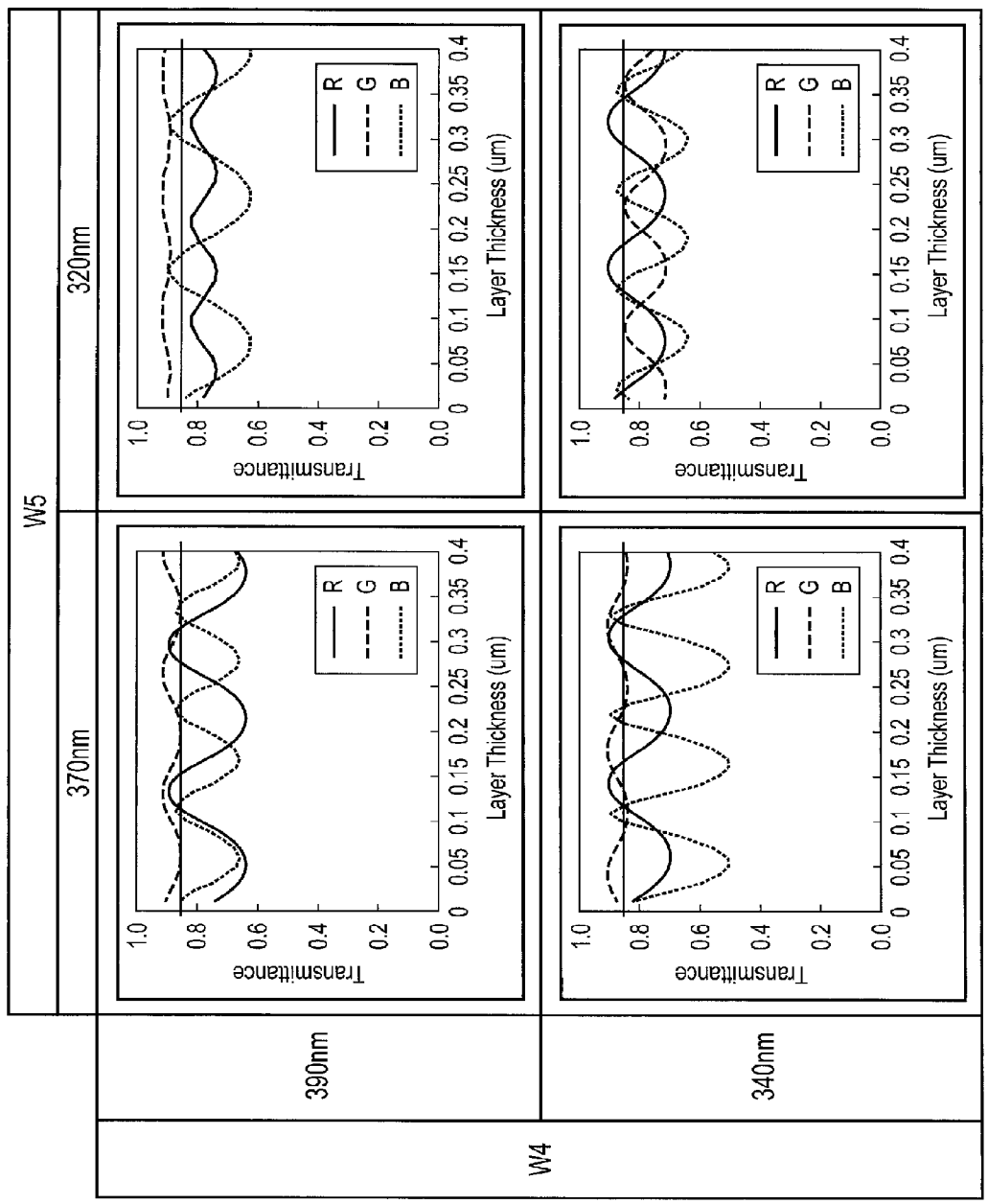
FIG. 10 shows an example of a transmissivity graph where a fifth thickness is 300 to 400 nm and a fourth thickness is 300 to 400 nm.

FIG. 10 shows an example of the transmissivity graph where the fifth thickness is 300 to 400 nm, and the fourth thickness is 300 to 400 nm.

FIG. 10 shows four graphs. First graph shows the transmissivity spectrum where W4 is 340 nm and W5 is 320 nm. Second graph shows the transmissivity spectrum where W4 is 340 nm and W5 is 370 nm. Third graph shows the transmissivity spectrum where W4 is 390 nm and W5 is 320 nm. Fourth graph shows the transmissivity spectrum where W4 is 390 nm and W5 is 370 nm.

If W4 is 340 nm and W5 is 320 nm, the values of the thicknesses W6 where each transmissivity of R, G, and B are all different, and thus, the evaluation result is NG2.

If W4 is 340 nm and W5 is 370 nm, a difference between the peak value and the valley value of the transmissivity of B is approximately 0.40, and thus, the evaluation result is NG3.

If W4 is 390 nm and W5 is 320 nm, the peak value of the transmissivity of B is less than 0.85, and thus, the evaluation result is NG1.

If W4 is 390 nm and W5 is 370 nm, the transmissivity of all R, G, and B becomes 85% or more when W6 is 110 nm, and thus, the evaluation result is OK1.

Note that if the peak value of the transmissivity of each of R, G, and B is 85% or more, and the thickness W6 is in a range where the transmissivity value before and after the peak value is 80% or more, the advantages of the present embodiment were obtained. This will be explained using the transmissivity spectrum of B which is easily influenced by interference and sensitive to a change of the thickness. For example, in the graph where W4 is 440 nm and W5 is 420 nm which can result in OK1, the transmissivity spectrum of B has its peak when W6 is 90 nm, and the value of the transmissivity of B becomes 80% or more when W6 is 90±10 nm. As above, the thickness W6 may be a suitable value±10 nm. In other thickness conditions which results in OK1, similarly, the transmissivity of B becomes 80% or more with W6 being 100±10 nm in a graph where W4 is 390 nm and W5 is 420 nm, and the transmissivity of B becomes 80% or more with W6 being 110±10 nm in a graph where W4 is 390 nm and W5 is 370 nm. As can be understood from the above, when the thickness W6 is 80 nm or more and 130 nm or less, the thicknesses W4 and W5 which satisfy the condition of OK1 exist. Here, the thickness W6 is, preferably, 90 nm or more and 110 nm or less; however, the same advantages can be obtained when the thickness W6 is 75 nm or more and 105 nm or less.

The above value range can be applied to the thicknesses W4 and W5. That is, the thickness conditions which result in OK1 as explained with reference to FIGS. 7 to 10 will be represented as follows. One condition which results in OK1 is W4 is 390±10 nm, W5 is 370±10 nm, and W6 is 110±10 nm. Furthermore, another condition which results in OK1 is W4 is 390±10 nm, W5 is 420±10 nm, and W6 is 100±10 nm. Furthermore, still another condition which results in OK1 is W4 is 440±10 nm, W5 is 420±10 nm, and W6 is 90±10 nm.

Similarly, the thickness conditions which result in OK2 as explained with reference to FIGS. 7 to 10 will be represented as follows. One condition which results in OK2 is W4 is 490±10 nm, W5 is 370±10 nm, and W6 is 300±10 nm in the area opposed to the red color filter layer and W6 is 110±10 nm, 220±10 nm, or 330±10 nm in the area opposed to the blue color filter layer. Note that W6 is, preferably, 220±10 nm or 330±10 nm in the area opposed to the blue color filter layer. Furthermore, another condition which results in OK2 is W4 is 340±10 nm, W5 is 420±10 nm, and W6 is 130±10 nm in the area opposed to the red color filter layer and W6 is 90±10 nm, 200±10 nm, or 310±10 nm in the area opposed to the blue color filter layer. Note that W6 is, preferably, 90±10 nm or 200±10 nm in the area opposed to the blue color filter layer.

Now, examples of the structure of the color filter layer CF in a plan view with reference to FIGS. 11 and 12. Note that a plan view is viewing the first substrate 100 from the second substrate 200 side along the third direction Z.

FIG. 11 shows a first arrangement of the color filter layer.

In the example depicted, the color filter layer CF includes red (R) color filter layer CF1, green (G) color filter layer CF2, and blue (B) color filter layer CF3.

The color filter layers CF1, CF2, and CF3 are formed as bands extending in the second direction Y. The color filter layer CF2 is adjacent to the color filter layers CF1 and CF3 in the first direction X, and is disposed between the color filter layer CF1 and the color filter layer CF3.

FIG. 12 shows a second arrangement of the color filter layer.

In the example depicted, the color filter layer CF includes red (R) color filter layer CF1, green (G) color filter layer CF2, blue (B) color filter layer CF3, and white (W) color filter layer CF4.

The color filter layers CF1 and CF2 are each formed in, for example, a square. The color filter layer CF1 is adjacent to the color filter layer CF2 in the second direction Y. The color filter layer CF1 and the color filter layer CF2 are arranged alternately in the second direction Y. The color filter layer CF3 is formed in, for example, a rectangle. The color filter layer CF3 is adjacent to the color filter layer CF1 and the color filter layer CF2 in the first direction X. The color filter layer CF4 is adjacent to the color filer layer CF1 and the color filter layer CF2 in the first direction X and is adjacent to the color filter layer CF3 in the second direction Y. The color filter layer CF3 and the color filter layer CF4 are arranged alternately in the second direction Y.

If the thickness W6 in the area opposed to the color filter layer CF1 is different from the thickness W6 in the area opposed to the color filter layer CF3, the thickness W6 in the area opposed to the color filter layer CF2 is, preferably, set to be equal to the thickness W6 in the area opposed to the color filter layer CF1. Furthermore, the thickness W6 in the area opposed to the color filter layer CF4 is, preferably, set to be equal to the thickness W6 in the area opposed to the color filter layer CF3. Here, the area of the same thickness of the insulating film 16 extends in the second direction Y and the areas of the different thicknesses of the insulating film 16 are arranged alternately in the first direction X. With such a structure, the insulating film 16 can control a change in the thicknesses in the second direction Y.

In the present embodiment, the display device DSP includes the insulating films 11 to 16, color filter layer CF, and first substrate 100 including a semiconductor layer, gate electrode, and source electrode. The insulating films 11, 14, and 16 are formed of a silicon nitride, and the insulating films 12, 13, and 15 are formed of silicon oxide. Thus, the display device DSP can suppress decreasing of light transmissivity of the display panel PNL caused by the interference by the interface reflection in each member by controlling the thicknesses W4, W5, and W6 of the insulating films 14, 15, and 16. Furthermore, since the light transmissivity of the display panel PNL is improved, even if the area of the aperture AP is decreased by pixels PX of high density, decreasing of the luminosity of pixels PX can be suppressed. Therefore, a display device which can suppress decreasing in the display quality can be achieved.

Furthermore, the thickness W5 of the insulating film 15 is, preferably, 350 nm or more and less than 450 nm. When the thickness W5 is within the above range, the thickness W4 of the insulating film 14 and the thickness W6 of the insulating film 16 which can achieve the display panel PNL of good transmissivity of red, green, and blue are available. That is, the present embodiment can achieve a display device DSP including a highly transmissive display panel PNL.

Furthermore, the thickness W4 is, preferably, 300 nm or more and less than 500 nm. When the thickness W4 is within the above range, the thickness W5 and the thickness W6 of the insulating film 16 which can achieve the display panel PNL of good transmissivity of red, green, and blue are available. That is, the present embodiment can achieve a display device DSP including a highly transmissive display panel PNL.

Furthermore, the thickness W4 is, preferably, 350 nm or more and less than 450 nm. When the thickness W4 is within the above range, the insulating film 16 is not required to be formed such that the area opposed to the red color filter layer and the area opposed to the blue color filter layer have different thicknesses. Thus, in the display device DSP, failures in the manufacturing process of the insulating film 16 can be suppressed.

Furthermore, the thickness W6 is, preferably, 80 nm or more and less than 120 nm. When the thickness W6 is within the above range, the thickness W4 and the thickness W5 which can achieve the display panel PNL of good transmissivity of red, green, and blue are available. That is, the present embodiment can achieve a display device DSP including a highly transmissive display panel PNL.

Note that, in the display device DSP of the present embodiment, the thickness W4 is 390±10 nm, the thickness W5 is 370±10 nm, and the thickness W6 is 110±10 nm, for example. Furthermore, the thickness W4 is 390±10 nm, the thickness W5 is 420±10 nm, and the thickness W6 is 100±10 nm, for example. Furthermore, the thickness W4 is 440±10 nm, the thickness W5 is 420±10 nm, and the thickness W6 is 90±10 nm, for example. In these cases, the display panel PNL of good transmissivity of red, green, and blue can be achieved.

Note that the insulating film 16 may be formed such that the thickness W6 in the area opposed to the red color filter layer is different from the thickness W6 in the area opposed to the blue color filter layer. Thereby, the thicknesses W6 can be set to maximize the transmissivity of red pixels and blue pixels. Note that the thickness W6 may be different between the area opposed to the red color filter layer and the area opposed to the green color filer layer, or may be different between the area opposed to the blue color filter layer and the area opposed to the green color filter layer.

The display device DSP includes the red color filter layer, green color filter layer, blue color filter layer, and white color filter layer. The red color filter layer and the green color filter layer are adjacent in the second direction Y and are arranged alternately. The blue color filter layer is adjacent to the red and green color filter layers in the first direction X. The blue color filter layer and the white color filter layer are adjacent in the second direction Y and are arranged alternately. If the thickness W6 in the area opposed to the red color filter layer is different from the thickness W6 in the area opposed to the blue color filter layer, the thickness W6 in the area opposed to the green color filter layer is equal to the thickness W6 in the area opposed to the red color filter layer, and the thickness W6 in the area opposed to the white color filter layer is equal to the thickness W6 in the area opposed to the blue color filter layer. Therefore, the area of the same thicknesses W6 extends along the second direction Y, the number of the areas in which different thicknesses W6 are formed decreases and failures in the formation process of the insulating film 16 can be suppressed.

In the display device DSP of the present embodiment, for example, the thickness W4 is 490±10 nm, the thickness W5 is 370±10 nm, the thickness W6 in the area opposed to the red color filter layer is 300±10 nm, the thickness W6 in the area opposed to the blue color filter layer is 110±10 nm, 220±10 nm, and 330±10 nm. Furthermore, for example, the thickness W4 is 340±10 nm, the thickness W5 is 420±10 nm, the thickness W6 in the area opposed to the red color filter layer is 130±10 nm, the thickness W6 in the area opposed to the blue color filter layer is 90±10 nm, 200±10 nm, and 310±10 nm. In these cases, the display panel PNL of good transmissivity of red, green, and blue can be achieved.

Furthermore, the display device DSP includes the insulating film 17 disposed on the color filter layer CF, pixel electrode PE disposed above the insulating film 17, common electrode CE opposed to the pixel electrode PE, and insulating film 18 between the pixel electrode PE and the common electrode CE. As above, even if many members formed by a dry process are disposed on the color filter layer CF, degradation of hue by heat degradation of the color filter layer CF can be compensated with the increase of the transmissivity of the display panel PNL by adjusting the thicknesses W4, W5, and W6. That is, in the present embodiment, the display device DSP of good color expression can be achieved.

As explained above, the present embodiment can achieve a display device which can suppress decreasing display quality.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A display device comprising:
an insulating substrate;
a first insulating film disposed on the insulating substrate;
a second insulating film disposed on the first insulating film;
a third insulating film disposed on the second insulating film;
a fourth insulating film disposed on the third insulating film;
a fifth insulating film disposed on the fourth insulating film;
a sixth insulating film disposed on the fifth insulating film;
a color filter layer disposed on the sixth insulating film;
a semiconductor layer disposed between the second insulating film and the third insulating film;
a gate electrode disposed between the third insulating film and the fourth insulating film; and
a source electrode disposed between the fifth insulating film and the sixth insulating film and electrically connected to the semiconductor layer, wherein
the first, fourth, and sixth insulating films are formed of a silicon nitride,
the second, third, and fifth insulating films are formed of a silicon oxide,
the color filter layer includes a first color filter layer and a second color filter layer,
a thickness of the sixth insulating film in an area opposed to the first color filter layer is different from a thickness of the sixth insulating film in an area opposed to the second color filter layer,
the first color filter layer is red, and the second color filter layer is blue,
the fourth insulating film is 490±10 nm in thickness,
the fifth insulating film is 370±10 nm in thickness,
the sixth insulating film in an area opposed to the red color filter layer is 300±10 nm in thickness, and
the sixth insulating film in an area opposed to the blue color filter layer is 110±10, 220±10, or 330±10 nm in thickness.

2. The display device of claim 1, further comprising:
a seventh insulating film disposed on the color filter layer;
a pixel electrode disposed above the seventh insulating film and electrically connected to the semiconductor layer;
a common electrode dispose in the same substrate in which the pixel electrode is disposed; and
an eighth insulating film disposed between the pixel electrode and the common electrode.

3. The display device of claim 1, wherein the color filter layer further includes a third color filter layer and a fourth color filter layer,
the first and third color filter layers are adjacent to the second color filter layer in a first direction,
the first color filter layer is adjacent to the third color filter layer in a second direction,
the fourth color filter layer is adjacent to the second color filter layer in the second direction, and
a thickness of the sixth insulating film in an area opposed to the first and third color filter layers is different from a thickness of the sixth insulating film in an area opposed to the second and fourth color filter layers.

4. The display device of claim 3, wherein a thickness of the sixth insulating film in an area opposed to the first color filter layer is equal to a thickness of the sixth insulating film in an area opposed to the third color filter layer, and a thickness of the sixth insulating film in an area opposed to the second color filter layer is equal to a thickness of the sixth insulating film in an area opposed to the fourth color filter layer.

* * * * *